United States Patent [19]
Furukawa et al.

[11] Patent Number: 5,586,148
[45] Date of Patent: Dec. 17, 1996

[54] COHERENT DETECTION SYSTEM

[75] Inventors: Hideto Furukawa; Kazuo Kawabata, both of Kawasaki, Japan

[73] Assignee: Fujitsu Limited, Kanagawa, Japan

[21] Appl. No.: 455,127

[22] Filed: May 31, 1995

[30] Foreign Application Priority Data

Jul. 27, 1994 [JP] Japan ............................ 6-175289

[51] Int. Cl.$^6$ .......................... H03D 1/00; H04L 27/06
[52] U.S. Cl. .......................... 375/340; 375/354; 342/99
[58] Field of Search .................... 375/340, 354; 342/99; 329/304; 455/69, 71, 227, 229

[56] References Cited

U.S. PATENT DOCUMENTS

| | | | |
|---|---|---|---|
| 3,903,525 | 9/1975 | Mullins et al. | 343/7.7 |
| 3,939,428 | 2/1976 | Shimizu et al. | 325/427 |
| 5,272,446 | 12/1993 | Chalmers et al. | 329/304 |

FOREIGN PATENT DOCUMENTS

| | | | |
|---|---|---|---|
| 0330531 | 2/1991 | Japan | H04B 1/16 |
| 809643 | 2/1981 | U.S.S.R. | H04L 27/14 |

*Primary Examiner*—Stephen Chin
*Assistant Examiner*—Don Vo

[57] ABSTRACT

A coherent detection system synchronously detects a received wave involving a Doppler shift. To realize a stable demodulation performance, the system has a memory for storing in advance Doppler shifts to be related to an input signal and corresponding pass bands to reduce the bit error rate of restored information to below an allowable maximum when the corresponding Doppler shifts are present; an estimating unit for finding levels of the input signal or instantaneous values R of the input signal that form an envelope, counting the number N per unit time of points where the envelope crosses a threshold, and estimating a Doppler shift fD according to an expression that indicates the ratio of the number N to the Doppler shift fD and involves the in-phase and orthogonal components of the input signal, a distribution of the temporal differentiation of these components, a distribution of power spectra, and the instantaneous values normalized by the threshold; and a band controller for retrieving a pass band corresponding to the estimated Doppler shift fD from the memory and setting the pass band to a filter of the system.

4 Claims, 9 Drawing Sheets

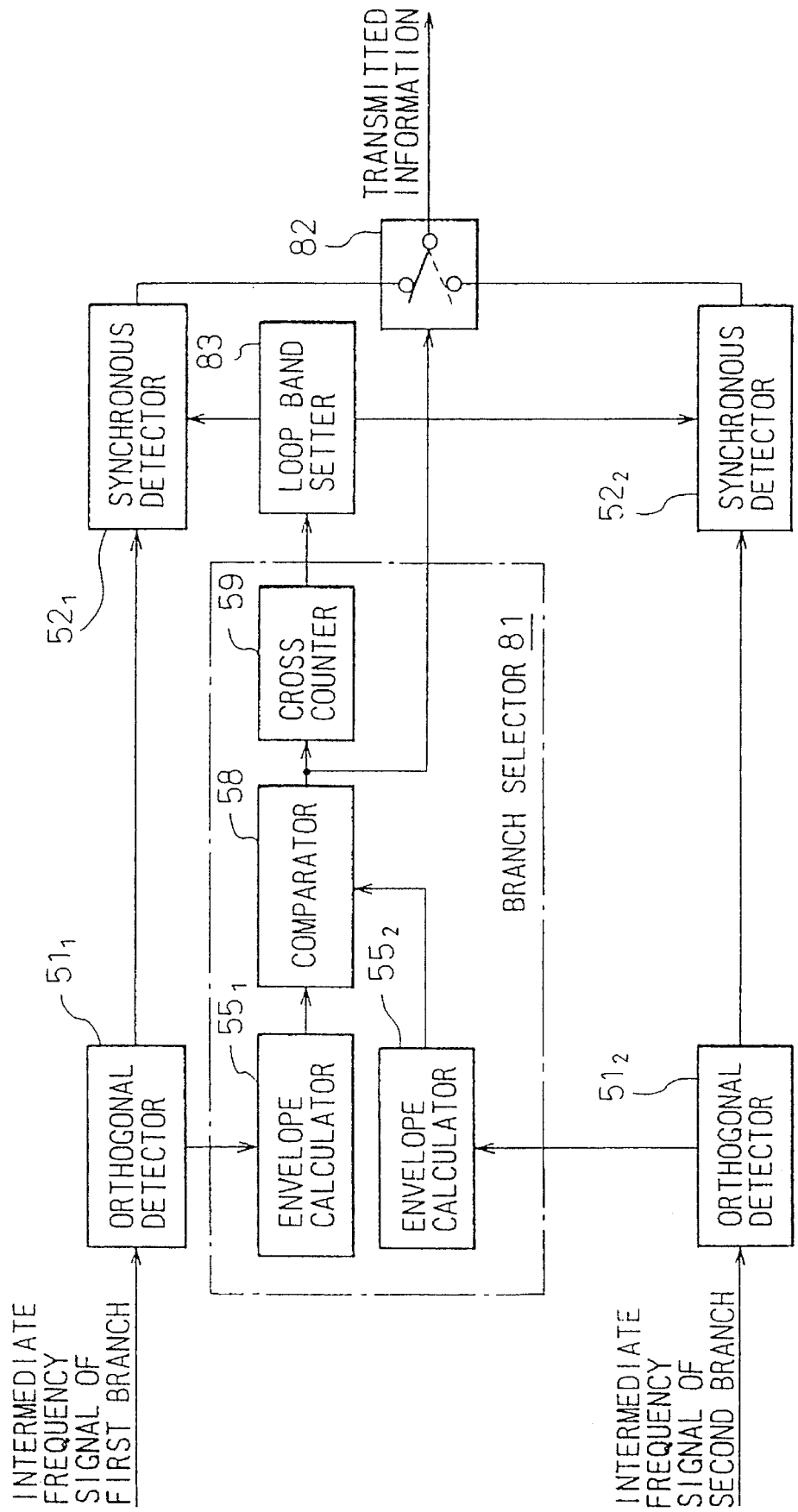

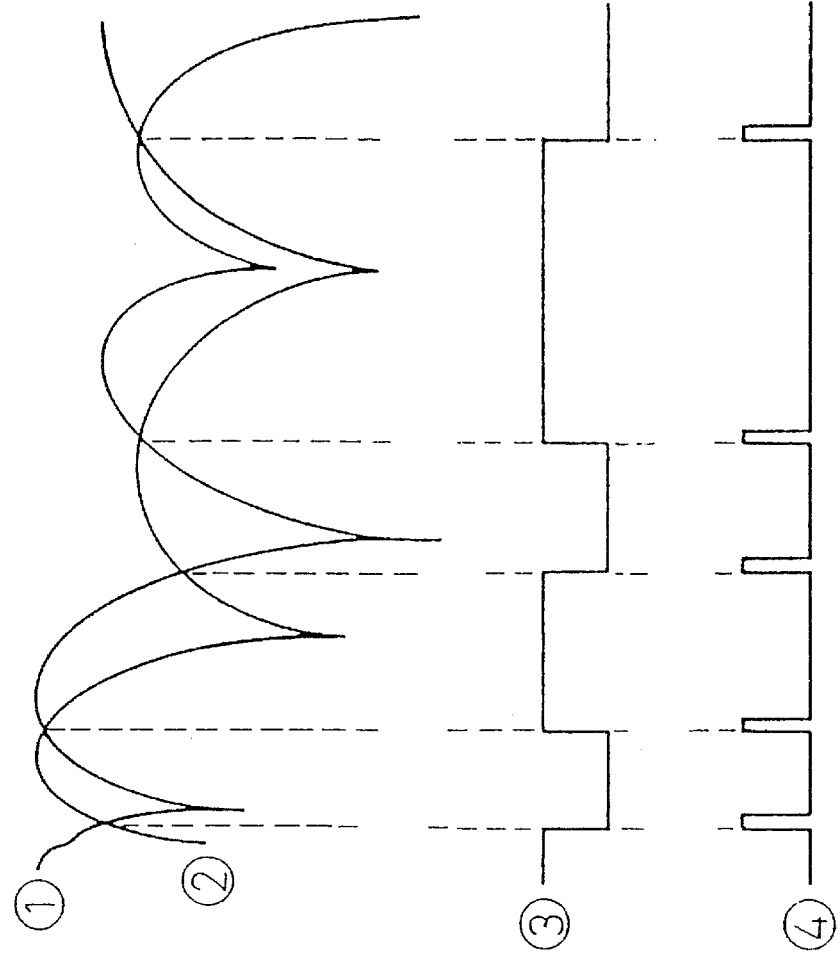
FIG. 8A { ① INSTANTANEOUS VALUE R1 OF ENVELOPE (BRANCH 1)
② INSTANTANEOUS VALUE R2 OF ENVELOPE (BRANCH 2)
FIG. 8B ③ BINARY OUTPUT SIGNAL OF COMPARATOR
FIG. 8C ④ PULSE SIGNAL

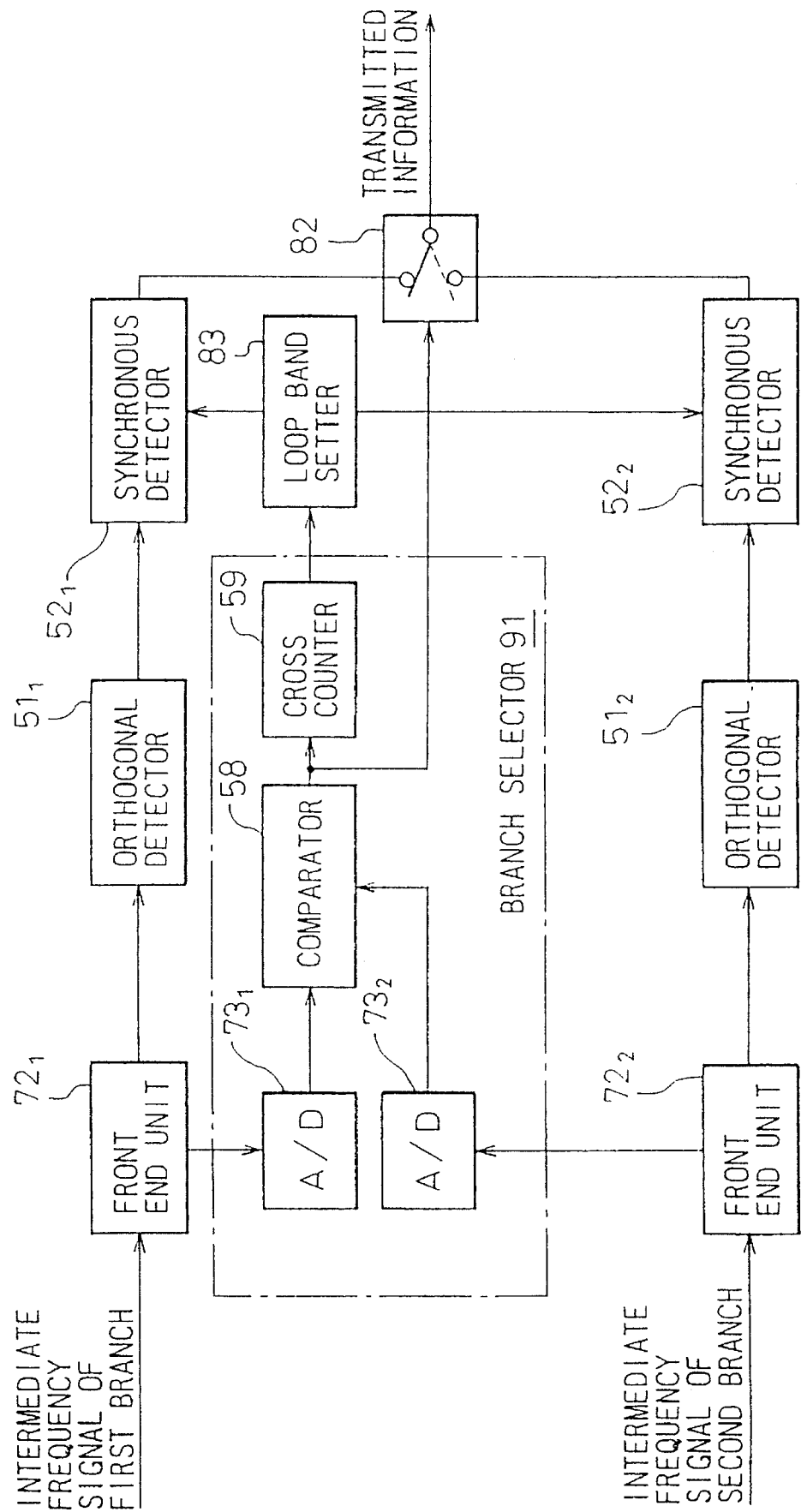

COHERENT DETECTION SYSTEM

BACKGROUND OF THE INVENTION

1. Field of the Invention

The present invention relates to a coherent detection system and, particularly, to a coherent detection system in a mobile communication system, for synchronously detecting a wave transmitted from a high-speed mobile object through a radio transmission path.

2. Description of the Related Art

Many studies are being made on a mobile communication system using a communication satellite that covers a wide service area without many base stations. Expanding the service area of an existing ground mobile communication system has also been studied.

A ground mobile communication system involves base and mobile stations. When a mobile station moves, a radio transmission path between the mobile and base stations is disturbed by radio reflection, diffraction, scattering, etc., caused by topography and ground obstacles. In addition, many signals from other transmission paths arrive at a reception end of the radio transmission path, and therefore, the reception end is affected by considerable fading caused by the sum of the vectors of these signals.

To maintain transmission quality in spite of the fading, the phase noise, and the heat noise, the reception end usually employs a delay detector that secures a stable operation without regenerating the carrier signal from a received wave.

On the other hand, a coherent detector incorporating a carrier regenerator regenerates a carrier signal from a received wave and calculates the product of the carrier signal and received wave, to demodulate the received wave. If the scale of a fading in a radio transmission path is within an allowable range, employing a coherent detector instead of the delay detector effectively suppresses noise orthogonal to a carrier signal and improves the transmission quality.

The carrier regenerator of the coherent detector has an intrinsic loop bandwidth BL, which is usually preset to one several hundredth of a transmission speed, or several tens of times a Doppler shift, to secure a required C/N ratio, minimize a noise bandwidth, and stably regenerate a carrier according to a deviation in the frequency of the carrier of a received wave.

The speed of a low orbit satellite relative to an earth station or a mobile station on the ground is about 7 to 8 km/s to cause a Doppler shift fD of about 2 to 3 kHz in a received wave. Due to this relative speed and a large fluctuation in the relative speed, a Doppler shift in the satellite mobile communication system is quite large compared with that in the ground mobile communication system. The Doppler shift in the ground mobile communication system is only about 100 Hz when a mobile station is moving at a speed of 100 km/h.

If the Doppler shift fluctuates greatly, the loop band width BL will be out of an optimum range. Namely, when the ratio R (=BL/fD) of the loop band width BL to the Doppler shift fD greatly differs from an optimum ratio R0, the demodulation performance of a reception end deteriorates to increase a bit error rate.

The fading mentioned above causes phase noise in the coherent detector of the ground mobile communication system and stops the coherent detector regenerating a carrier signal phase-synchronized with a received wave. Then, the coherent detector is not substitutable for the delay detector.

SUMMARY OF THE INVENTION

An object of the present invention is to provide a coherent detection system capable of demodulating a received wave even when a large Doppler shift occurs.

In order to accomplish the object, a first aspect of the present invention provides a coherent detection system having a signal processing unit for processing an input signal, which has been modulated by information according to a modulation method, in a radio frequency band or base band in proper consideration of the modulation method and generating a modulation-component-suppressed control signal; a filter for limiting the band of the control signal, to suppress the noise components thereof; and a detector for adjusting an oscillation frequency according to the noise-suppressed control signal, regenerating a carrier signal phase-synchronized with the input signal, and carrying out a coherent detection process according to the carrier signal, to retrieve the transmitted information. This system is characterized by a memory for storing in advance Doppler shifts to be related to the input signal and corresponding pass bands to reduce the bit error rate of the restored information to below an allowable maximum when the corresponding Doppler shifts are present; an estimating unit for finding levels of the input signal or instantaneous values R of the input signal that form an envelope, counting the number N per unit time of points where the envelope crosses a threshold, and estimating a Doppler shift fD according to an expression that indicates the ratio of the number N to the Doppler shift fD and involves the in-phase and orthogonal components of the input signal, the expression being provided by a distribution of the temporal differentiation of these components, a distribution of power spectra, and the instantaneous values normalized by the threshold; and a band controller for retrieving a pass band corresponding to the estimated Doppler shift fD from the memory and setting the filter to the pass band.

A second aspect of the present invention provides a coherent detection system having a signal processing unit for processing an input signal, which has been modulated by information according to a modulation method, in a radio frequency band or base band in proper consideration of the modulation method and generating a modulation-component-suppressed control signal; a filter for limiting the band of the control signal, to suppress the noise components thereof; and a detector for adjusting an oscillation frequency according to the noise-suppressed control signal, regenerating a carrier signal phase-synchronized with the input signal, and carrying out a coherent detection process according to the carrier signal, to retrieve the transmitted information. This system is characterized by a memory for storing in advance Doppler shifts to be related to the input signal and corresponding pass bands to reduce the bit error rate of the restored information to below an allowable maximum when the corresponding Doppler shifts are present; an estimating unit for finding levels of the input signal or values R of the input signal that form an envelope as well as an average Vav of the values R, counting the number N per unit time of points where the envelope crosses the average Vav, and estimating a Doppler shift fD according to an expression of $fD = \pi^{-1/2} e^{1/2} N$; and a band controller for retrieving a pass band corresponding to the estimated Doppler shift fD from the memory and setting the filter to the pass band.

A third aspect of the present invention provides a coherent detection system having signal processing units for separately processing two input signals, which have been modulated by common information according to a modulation method and received through respective branches, in a radio frequency band or base band in proper consideration of the modulation method and generating respective modulation-component-suppressed control signals; filters for limiting the bands of the control signals, respectively, to suppress the noise components thereof; detectors for varying oscillation frequencies according to the respective noise-suppressed control signals, regenerating carrier signals phase-synchronized with the input signals, respectively, and simultaneously carrying out coherent detection processes according to the carrier signals, to separately provide the transmitted information; and a diversity controller for finding levels of the input signals or components of the input signals that form envelopes and selecting one of the information pieces provided by the detectors according to the levels of the input signals. This system is characterized by a memory for storing in advance Doppler shifts to be related to the input signals and corresponding pass bands to reduce the bit error rate of the restored information to below an allowable maximum when the corresponding Doppler shifts are present; an estimating unit for counting the number Fb of changes in the selection of the diversity controller per unit time and estimating a Doppler shift fD according to an expression of fD=Fb/1.3; and a band controller for retrieving a pass band corresponding to the estimated Doppler shift fD from the memory and setting the filters to the pass band.

A fourth aspect of the present invention provides a coherent detection system having signal processing units for separately processing two input signals, which have been modulated by common information according to a modulation method and received through respective branches, in a radio frequency band or base band in proper consideration of the modulation method and generating respective modulation-component-suppressed control signals; filters for limiting the bands of the control signals, respectively, to suppress the noise components thereof; detectors for adjusting oscillation frequencies according to the respective noise-suppressed control signals, regenerating carrier signals phase-synchronized with the input signals, respectively, and simultaneously carrying out coherent detection processes according to the carrier signals, to separately provide the transmitted information; and a diversity controller for finding levels of the input signals or components of the input signals that form envelopes and selecting one of the information pieces provided by the detectors according to the levels of the input signals. This system is characterized by a memory for storing in advance Doppler shifts to be related to the input signals and corresponding pass bands to reduce the bit error rate of the restored information to below an allowable maximum when the corresponding Doppler shifts are present; an estimating unit for counting the number Fb of changes in the selection of the diversity controller per unit time and estimating a Doppler shift fD according to an expression of fD=Fb/2.6 P with the P being the probability of a change occuring in the selection of the diversity controller per unit time; and a band controller for retrieving a pass band corresponding to the estimated Doppler shift fD from the memory and setting the filters to the pass band.

BRIEF DESCRIPTION OF THE DRAWINGS

The present invention will be more clearly understood from the description as set forth below with reference to the accompanying drawings in which:

FIG. 7 is a block diagram showing a coherent detection system according to a first embodiment of the third and fourth aspects of the present invention;

FIGS. 8A to 8C explain the operation of the embodiment of FIG. 7; and

FIG. 9 is a block diagram showing a coherent detection system according to a second embodiment of the third and fourth aspects of the present invention.

DESCRIPTION OF THE PREFERRED EMBODIMENTS

Figure 1:
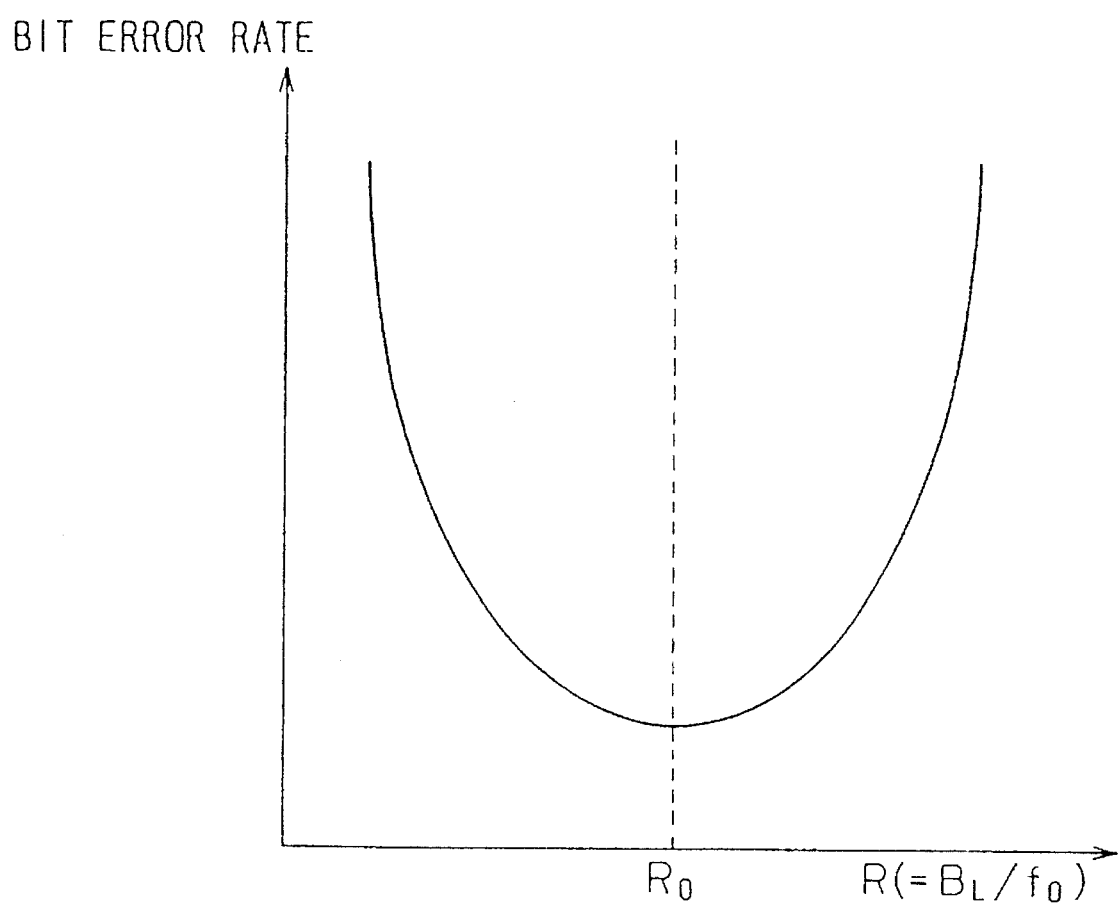
FIG. 1 is a graph showing the relationship between loop band widths and Doppler shifts.

FIG. 1 is a graph showing the relationship between loop band widths and Doppler shifts.

The loop band width BL will not be maintained properly if the Doppler shift widely fluctuates. Namely, the ratio R of the loop band width BL to the Doppler shift fD deviates from an optimum value R0 as the Doppler shift fluctuates, to deteriorate a demodulation performance and increase a bit error rate.

Figure 2:
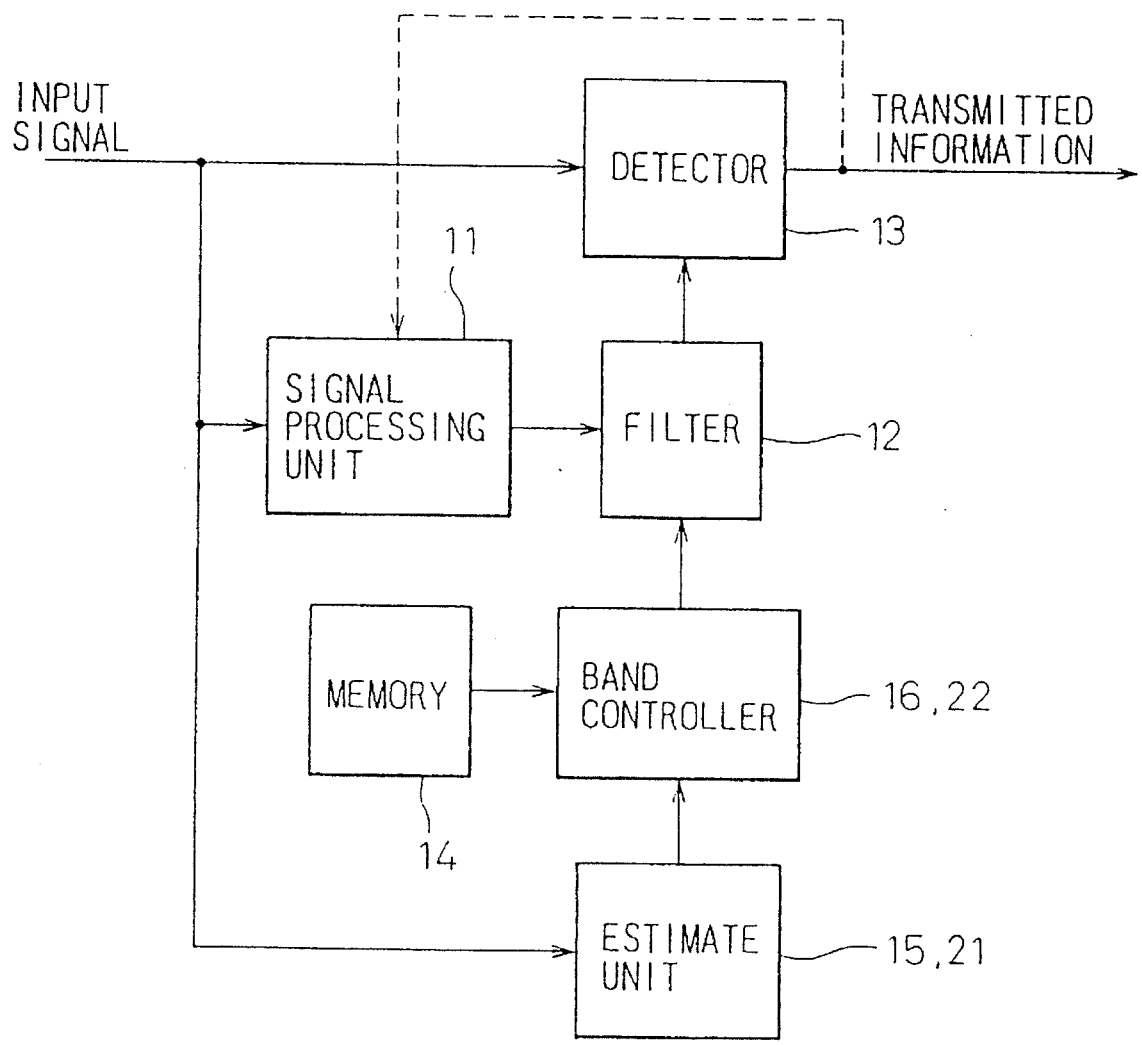
FIG. 2 is a block diagram showing a basic arrangement of a coherent detection system according to the first and second aspects of the present invention.

FIG. 2 is a block diagram showing a coherent detection system according to the first and second aspects of the present invention.

The system of FIG. 2 will be explained according to the first aspect of the present invention.

A signal processing unit 11 processes an input signal, which has been modulated by information according to a modulation method, in a radio frequency band or base band in proper consideration of the modulation method, and generates a modulation-component-suppressed control signal. A filter 12 limits the band of the control signal, to suppress the noise components thereof. A detector 13 adjusts an oscillation frequency according to the noise-suppressed control signal, regenerates a carrier signal phase-synchronized with the input signal, and carries out a coherent detection process according to the carrier signal, to retrieve the transmitted information.

Parts characteristic to this system will be explained.

A memory 14 contains Doppler shifts to be related to the input signal and corresponding pass bands to reduce the bit error rate of the restored information to below an allowable maximum when the corresponding Doppler shifts are present. An estimating unit 15 finds levels of the input signal or instantaneous values R of the input signal that form an envelope, counts the number N per unit time of points where the envelope crosses a threshold, and estimates a Doppler shift fD according to an expression that indicates the ratio of the number N to the Doppler shift fD and involves the in-phase and orthogonal components of the input signal. The expression is provided by a distribution of the temporal differentiation of these components, a distribution of power spectra, and the instantaneous values normalized by the threshold. A band controller 16 retrieves a pass band corresponding to the estimated Doppler shift fD from the memory 14 and sets the filter 12 to the pass band.

In this way, the estimating unit 15 finds levels of an input signal or instantaneous values R of the input signal that form an envelope, counts the number N per unit time of points where the envelope crosses a threshold, and estimates a Doppler shift fD according to the expression that indicates the ratio of the number N to the Doppler shift fD and involves the in-phase and orthogonal components of the input signal. The expression is provided by a distribution of the temporal differentiation of these components, a distribution of power spectra, and the instantaneous values normalized by the threshold. The band controller 16 retrieves a pass band corresponding to the estimated Doppler shift fD from the memory 14 and sets the filter 12 to the pass band.

The pass band of the filter 12, which sets the band of a loop from the signal processing unit 11 to the detector 13, is stored in advance in the memory 14, to reduce the bit error rate of the output of the detector 13 to below an allowable maximum when the corresponding Doppler shift is present. Consequently, the pass band is adjusted to the Doppler shift, to stabilize the demodulation performance of the system.

The system of FIG. 2 will be explained according to the second aspect of the present invention.

A signal processing unit 11 processes an input signal, which has been modulated by information according to a modulation method, in a radio frequency band or base band in proper consideration of the modulation method and generates a modulation-component-suppressed control signal. A filter 12 limits the band of the control signal, to suppress the noise components thereof. A detector 13 adjusts an oscillation frequency according to the noise-suppressed control signal, regenerates a carrier signal phase-synchronized with the input signal, and carries out a coherent detection process according to the carrier signal, to retrieve the transmitted information.

Parts characteristic to this system will be explained.

A memory 14 holds Doppler shifts to be related to the input signal and corresponding pass bands to reduce the bit error rate of the restored information to below an allowable maximum when the corresponding Doppler shifts are present. An estimate unit 21 finds levels of the input signal or values R of the input signal that form an envelope as well as an average Vav of the values R, counts the number N per unit time of points where the envelope crosses the average Vav, and estimates a Doppler shift fD according to an expression of $fD=\pi^{-1/2}e^{1/2}N$. A band controller 22 retrieves a pass band corresponding to the estimated Doppler shift fD from the memory 14 and sets the filter 12 to the pass band.

In this way, the estimating unit 21 finds levels of an input signal or values R of an input signal that form an envelope as well as an average Vav of the values R, counts the number N per unit time of points where the envelope crosses the average Vav, and estimates a Doppler shift fD according to the expression of $fD=\pi^{-1/2}e^{1/2}N$.

This expression provides a Doppler shift fD when the number N is a maximum, and is simpler than that used by the estimating unit 15 of the first aspect of the present invention. Consequently, the band controller 22 speedily sets the filter 12 to the pass band, the pass band being proper for the maximum number N for the Doppler shift. As a result, this system provides a stable demodulation performance even if the Doppler shift fluctuates widely.

Figure 3:
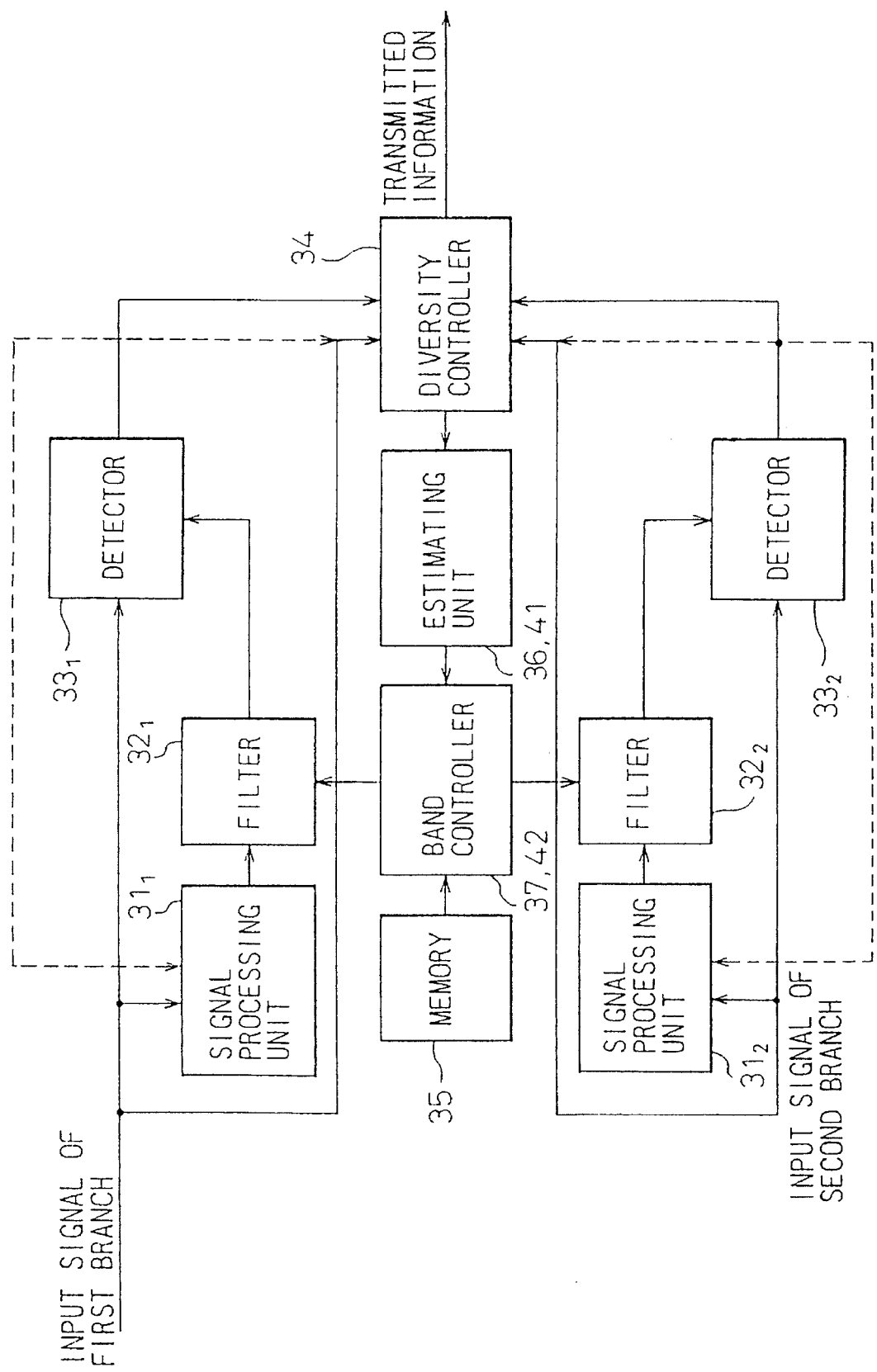
FIG. 3 is a block diagram showing a basic arrangement of a coherent detection system according to the third and fourth aspects of the present invention.

FIG. 3 is a block diagram showing a coherent detection system according to the third and fourth aspects of the present invention.

The system of FIG. 3 will be explained according to the third aspect of the present invention.

Signal processing units $31_1$ and $31_2$ separately process two input signals, which have been modulated by common information according to a modulation method and received through respective branches, in a radio frequency band or base band in proper consideration of the modulation method and generate respective modulation-component-suppressed control signals. Filters $32_1$ and $32_2$ limit the band widths of the control signals, respectively, to suppress the noise components thereof. Detectors $33_1$ and $33_2$ adjust oscillation frequencies according to the respective noise-suppressed control signals, regenerate carrier signals phase-synchronized with the input signals, respectively, and simultaneously carry out coherent detection processes according to the carrier signals, to separately restore the transmitted information. A diversity controller 34 finds levels of the input signals or components of the input signals that form envelopes and selects one of the information pieces provided by the detectors $33_1$ and $33_2$ according to the levels of the input signals.

Parts characteristic to this system will be explained.

With regard to filters $32_1$, $32_2$, a memory 35 stores in advance pass bands that make the bit error rate of transmitted data below an allowable maximum, in correspond to Doppler shifts of the input signals. The bit error rate is obtained from detectors $33_1$, $33_2$. An estimating unit 36 counts the number Fb of changes in the selection of the diversity controller 34 per unit time, and estimates a Doppler shift fD according to an expression of fD=Fb/1.3. A band controller 37 retrieves a pass band corresponding to the estimated Doppler shift fD from the memory 35 and sets the pass band to the filters $32_1$ and $32_2$.

In this way, the diversity controller 34 finds levels of input signals or components R1 and R2 of the input signals that form envelopes. The estimate unit 36 counts the number Fb of changes in the selection of the diversity controller 34 per unit time, and estimates a Doppler shift fD according to fD=Fb/1.3. This is because the number Fb of changes is expected to be equal to an inverse of the product of a time width (=1/2.6 fD) for which an autocorrelation of the values R1 and R2 provided by a first-kind Bessel function under the Doppler shift involved in the input signals is zeroed and the probability (=0.5) of causing a change in the output of the diversity controller 34 for the time width. The probability of 0.5 mentioned above is true when the regular characteristics of the two branches are substantially identical to each other.

The band controller 37 retrieves a pass band corresponding to the estimated Doppler shift fD from the memory 35 and sets the filters $32_1$ and $32_2$ to the pass band.

The pass band of the filters $32_1$ and $32_2$, which is the band width of a loop from the signal processing unit $31_1$ to the detector $33_1$ and the band width of a loop from the signal processing unit $31_2$ to the detector $33_2$, respectively, is stored in advance in the memory 35, to reduce the bit error rates of the outputs of the detectors $33_1$ and $33_2$ to below an allowable maximum when the corresponding Doppler shift is present. Accordingly, the pass band is adjusted to the Doppler shift, to stabilize the demodulation performance of the system.

The system of FIG. 3 will be explained according to the fourth aspect of the present invention.

Signal processing units $31_1$ and $31_2$ separately process two input signals, which have been modulated by common information according to a modulation method and received through respective branches, in a radio frequency band or base band in proper consideration of the modulation method, and generate respective modulation-component-suppressed control signals. Filters $32_1$ and $32_2$ limit the bands of the control signals, respectively, to suppress the noise components thereof. Detectors $33_1$ and $33_2$ adjust oscillation frequencies according to the respective noise-suppressed control signals, regenerate carrier signals phase-synchronized with the input signals and simultaneously carry out coherent detection processes according to the carrier signals, to separately provide the transmitted information. A diversity controller 34 finds levels of the input signals or components of the input signals that form envelopes and selects one of the information pieces provided by the detectors $33_1$ and $33_2$ according to the levels of the input signals.

Parts characteristic to this system will be explained.

A memory 35 stores in advance Doppler shifts to be related to the input signals and corresponding pass bands to reduce the bit error rate of each piece of the restored information to below an allowable maximum when the corresponding Doppler shifts are present. An estimation unit 41 counts the number Fb of changes in the selection of the diversity controller 34 per unit time, and estimates a Doppler shift fD according to an expression of fD=Fb/2.6 P with the P being the probability of a change occuring in the selection of the diversity controller 34 per unit time. A band controller 42 retrieves a pass band corresponding to the estimated Doppler shift fD from the memory 35 and sets the filters $32_1$ and $32_2$ to the pass band.

In this way, the diversity controller 34 finds levels of input signals or components R1 and R2 of the input signals that form envelopes. The estimate unit 41 counts the number Fb of changes in the selection of the diversity controller 34 per unit time, and estimates a Doppler shift fD according to fD=Fb/2.6 P. This is because the number Fb of changes is expected to be equal to an inverse of the product of a time width (=1/2.6 fD) for which an autocorrelation of the values R1 and R2 provided by a first-kind Bessel function under the Doppler shift involved in the input signals is zeroed and the probability (=0.5) of causing a change in the output of the diversity controller 34 for the time width.

When the regular radio transmission characteristics of the two branches are greatly different from each other, the probability P may be set accordingly.

In this way, the band controller 42 retrieves a proper pass band from the memory 35 according to the estimated Doppler shift fD and sets the filters $32_1$ and $32_2$ to the pass band. Namely, the pass band is proper for the radio transmission characteristics of the two branches, and therefore, the system provides a stabilized correct demodulation performance even if the Doppler shift fluctuates widely.

Embodiments of the present invention will be explained in detail with reference to the drawings.

Figure 4:
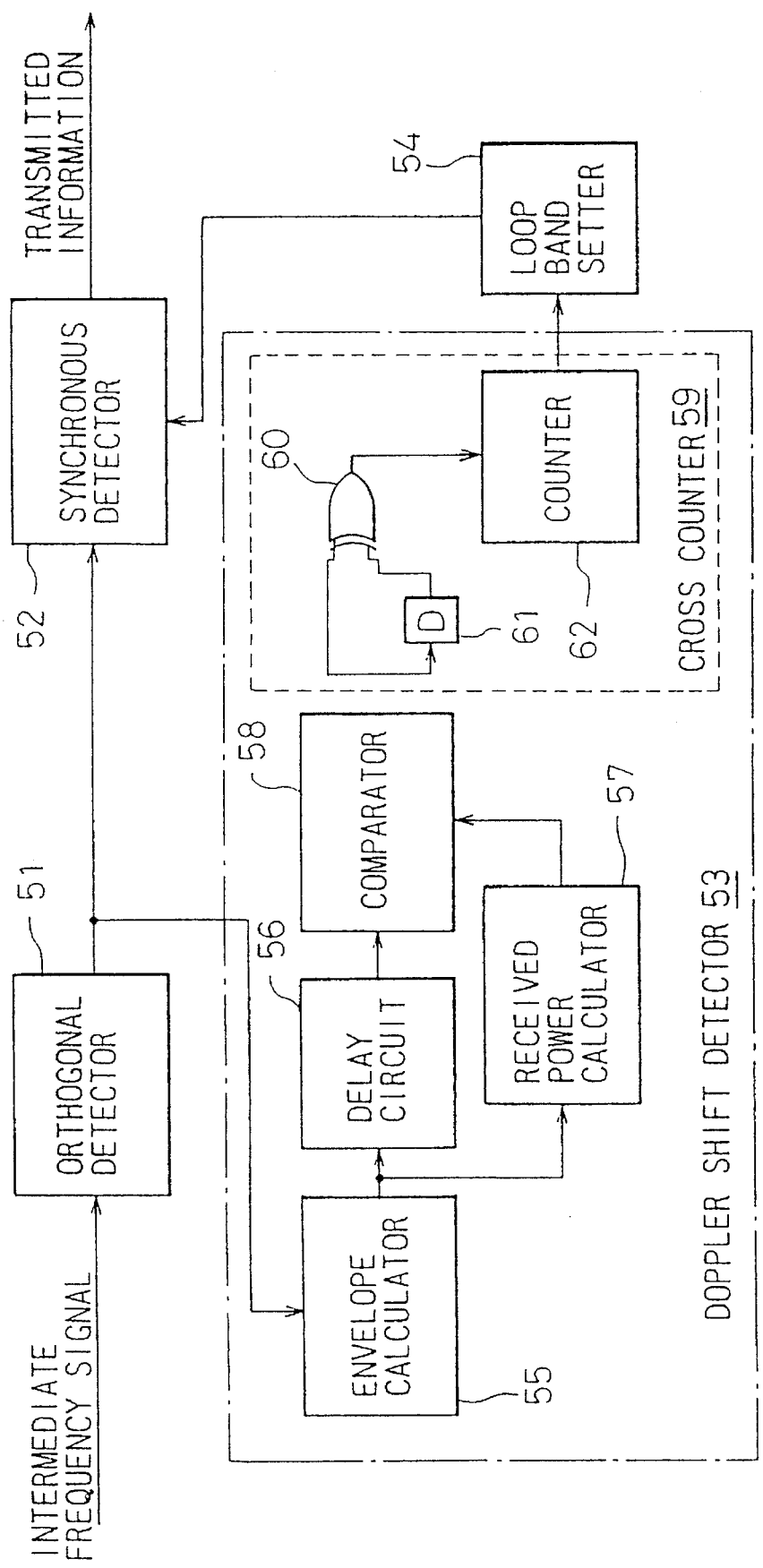
FIG. 4 is a block diagram showing a coherent detection system according to a first embodiment of the first and second aspects of the present invention.

FIG. 4 shows a coherent detection system according to the first embodiment of the first and second aspects of the present invention.

An orthogonal detector 51 receives an intermediate frequency signal converted from a received wave and provides orthogonal I- and Q-channel outputs, which are supplied to a coherent detector 52 and a Doppler shift detector 53. The output of the Doppler shift detector 53 is given to a loop band setter 54, which provides a control voltage to a control input terminal of the coherent detector 52. Then, the coherent detector 52 demodulates transmitted information per symbol. The coherent detector 52 has a carrier regenerator (not shown) having a circuit for adjusting and presetting a loop bandwidth BL in response to the control voltage from the loop band width setter 54.

In the Doppler shift detector 53, the I- and Q-channel outputs of the orthogonal detector 51 are supplied to an envelope calculator 55. The output of the envelope calculator 55 is supplied to a delay circuit 56 and a received power calculator 57. The outputs of the delay circuit 56 and received power calculator 57 are supplied to a comparator 58. The output of the comparator 58 is supplied to a cross counter 59 whose output is supplied to the loop band width setter 54.

In the cross counter 59, the output of the comparator 58 is connected to an input terminal of an exclusive-OR gate 60 and to a delay circuit 61 whose output is connected to the other input terminal of the exclusive-OR gate 60. The output of the exclusive-OR gate 60 is connected to a counter 62 whose output is connected to the loop band setter 54.

The orthogonal detector 51 and coherent detector 52 correspond to the signal processing unit 11, filter 12, and detector 13 of FIG. 2. The loop band setter 54 corresponds to the memory 14 and band controller 16 (21) of FIG. 2. The Doppler shift detector 53 corresponds to the estimate unit 15 (21) of FIG. 2.

Figure 5:
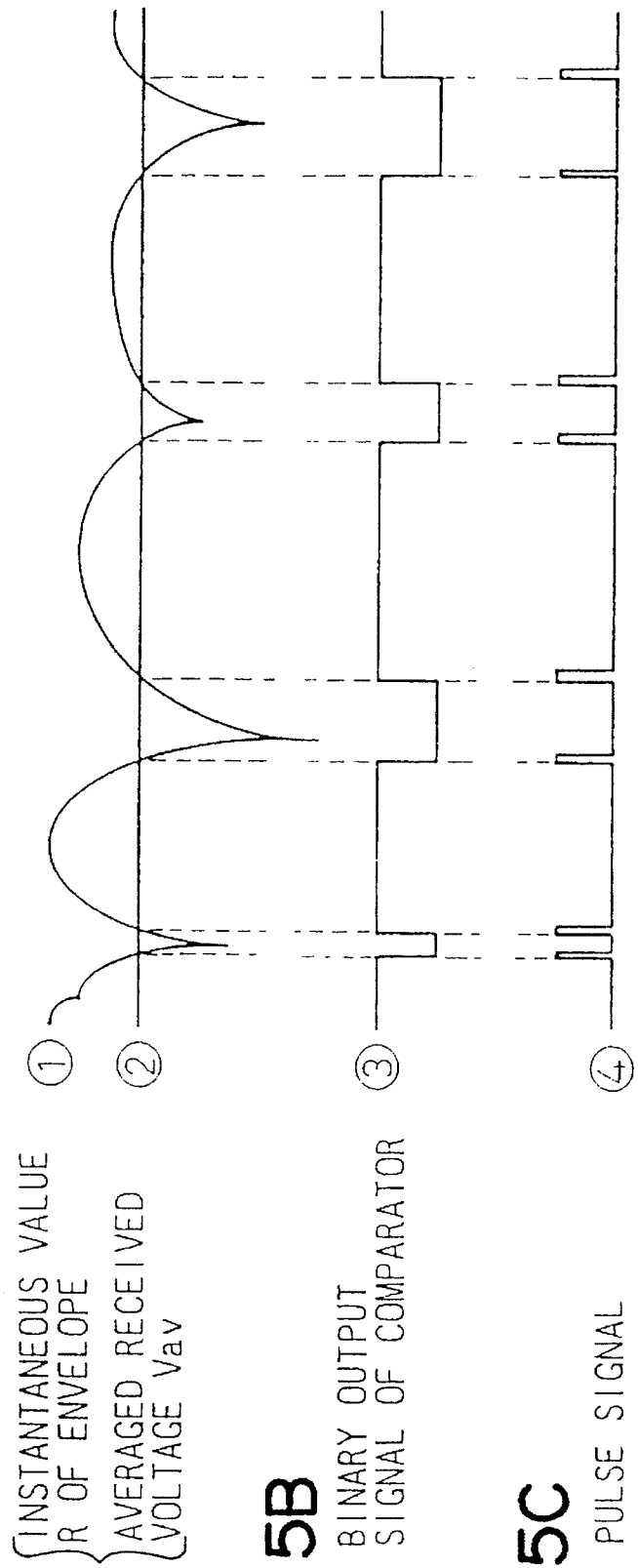
FIGS. 5A to 5C explains the operation of the embodiment of FIG. 4.

FIG. 5 shows the operation of the system of FIG. 4.

The orthogonal detector 51 orthogonally demodulates an intermediate frequency signal converted from a received wave and provides orthogonal I- and Q-channel demodulated signals. According to the demodulated signals, the carrier regenerator in the coherent detector 52 generates a carrier signal phase-synchronized with the received wave. The coherent detector 52 calculates the product of the carrier signal and demodulated signals and restores the transmitted information.

A relationship between each loop bandwidth BL and a control voltage applied to the carrier regenerator of the coherent detector 52 is measured in advance, and a table of loop bandwidths and corresponding control voltages is prepared. The table is stored in a read-only memory (not shown) in the loop bandwidth setter 54. The read-only memory also stores the ratio R (FIG. 1) of each loop bandwidth to a corresponding Doppler shift fD, to minimize a bit error rate in consideration of a symbol structure, radio transmission path, transmission method, and modulation/demodulation method.

In the Doppler shift detector 53, the envelope calculator 55 receives the I- and Q-channel demodulated signals and calculates each instantaneous value R that forms an envelope ① of FIG. 5 according to instantaneous values i and q of the demodulated signals as follows:

$$R = \sqrt{i^2 + q^2}$$

The received power calculator 57 integrates the instantaneous values R and calculates an average power b0 of the received wave and an average received voltage Vav (② of FIG. 5) corresponding to the average power b0 as follows:

$$V_{av} = \sqrt{b_0}$$

The comparator 58 compares the instantaneous value R with the average received voltage Vav and provides a binary signal ③ of FIG. 5 to show which is greater than the other. The exclusive-OR gate 60 and delay circuit 61 form a differential circuit that provides a pulse signal ④ of FIG. 5 indicating change points of the binary signal.

The maximum number NRSmax per unit time of points where the envelope of the instantaneous values R crosses the average received voltage Vav is related to a Doppler shift fD as follows:

$$N_{RS,max} = \sqrt{2\pi} \; f_D \frac{R_s}{\sqrt{2b_0}} \exp\left[-\frac{R_s^2}{2b_0}\right] \quad (1)$$

$$= f_D \sqrt{\pi} \; e^{-1/2} = 1.075 f_D \quad (\because R_s = \sqrt{b_0})$$

where Rs is an optional one of the instantaneous values R. (Refer to expressions 3.27 and 3.28 on page 70 in "Basics of Mobile Communication" by Yoshihisa Okumura et al. of Electronics Information Communication Association.)

The counter 62 counts pulses of the pulse signal ④ and finds the number NRSmax of the expression (1).

The loop band setter 54 substitutes the number NRSmax for the left side of the expression (1) and estimates a momentarily changing Doppler shift fD as follows:

$$f_D = \frac{N_{RS,max}}{1.075}$$

The loop band setter 54 finds an optimum loop band width BL for the Doppler shift fD as follows:
BL=R0×fD The loop band setter 54 looks up the table stored in the read-only memory thereof to find a control voltage corresponding to the loop band width BL. The control voltage is converted into an analog value, which is applied to the carrier regenerator of the coherent detector 52.

In this way, this embodiment sets a proper loop band width BL according to a Doppler shift involved in a received wave and stably regenerates a carrier signal. Accordingly, this embodiment greatly improves the demodulation performance compared with the prior art. Even if strong fading occurs in a radio transmission path of a ground mobile communication system, this embodiment is capable of reducing disturbance caused by phase noise due to the fading and stably regenerating a carrier signal phase-synchronized with a received wave.

As mentioned above, the coherent detection system according to this embodiment provides a stable demodulation performance even if there are large Doppler shifts.

Figure 6:
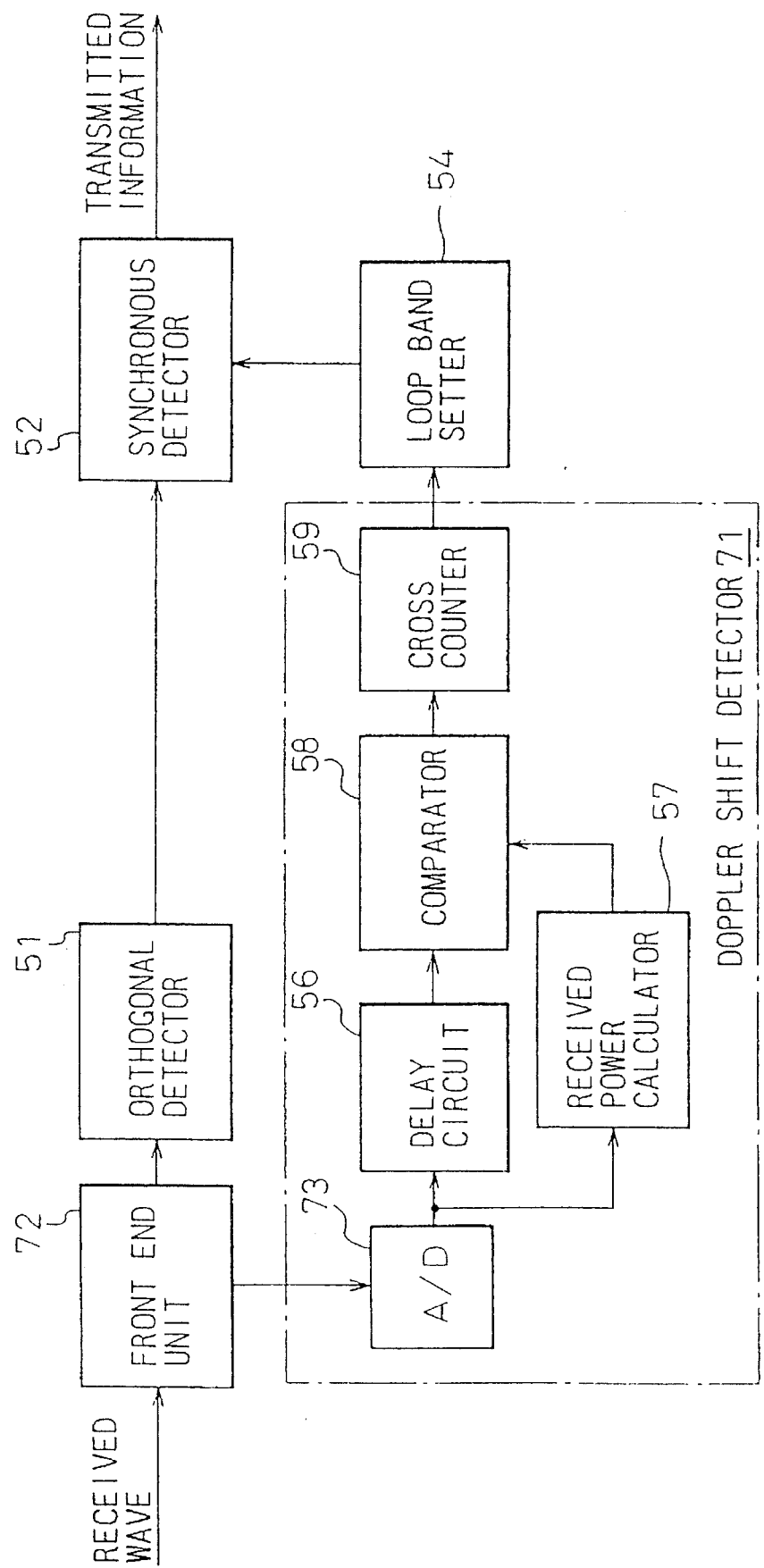
FIG. 6 is a block diagram showing a coherent detection system according to a second embodiment of the first and second aspects of the present invention.

FIG. 6 shows a coherent detection system according to a second embodiment of the first and second aspects of the present invention.

The same parts as those of FIG. 4 are represented with like reference marks and are not explained again.

The second embodiment of FIG. 6 differs from the first embodiment of FIG. 4 in that it employs a Doppler shift detector 71 instead of the Doppler shift detector 53, and a front end unit 72 to provide an intermediate frequency signal. The front end unit 72 provides the Doppler shift detector 71 with the electric field level of a received wave.

The Doppler shift detector 71 differs from the Doppler shift detector 53 in that it employs an A-D converter 73 instead of the envelope calculator 55. A cross counter 59 is the same as that of FIG. 4, and therefore, the details thereof are not shown in FIG. 6.

The front end unit 72, an orthogonal detector 51, and a coherent detector 52 of FIG. 6 correspond to the signal processing unit 11, filter 12, and detector 13 of FIG. 2. A loop band setter 54 of FIG. 6 corresponds to the memory 14 and band controller 16 (22) of FIG. 2. The Doppler shift detector 71 corresponds to the estimate unit 15 (21) of FIG. 2.

The operation of the coherent detection system according to the second embodiment will be explained.

The front end unit 72 successively detects the electric field level of a received wave and provides an RSSI signal that indicates the level as an analog voltage. Generally, an instantaneous value of the RSSI signal is nearly proportional to an instantaneous value of an envelope of the received wave. Namely, the A-D converter 73 provides an instantaneous value R of an envelope.

In this way, the front end unit 72 provides an analog RSSI signal that represents an instantaneous value of an envelope involved in a received wave. Arrangements from an output terminal of the A-D converter 73 to a control input terminal of the coherent detector 52 are the same as those of FIG. 4, so that the second embodiment also stably regenerates a carrier signal from a received wave even if it involves a large Doppler shift. Namely, the second embodiment provides a stable demodulation performance even under a wide range of Doppler shifts.

FIG. 7 is a coherent detection system according to a first embodiment of the third and fourth aspects of the present invention.

The same parts as those of FIG. 4 are represented with like reference marks and are not explained again.

Orthogonal detectors $51_1$ and $51_2$ receive intermediate frequency signals through two branches. The outputs of the orthogonal detectors $51_1$ and $51_2$ are supplied to coherent detectors $52_1$ and $52_2$, respectively, and to a branch selector 81. The outputs of the coherent detectors $52_1$ and $52_2$ are supplied to contacts of a switch 82, respectively. The common node of the switch 82 provides transmitted information. The branch selector 81 provides a first output to a control input terminal of the switch 82 and a second output to a loop band setter 83. The loop band setter 83 provides first and second outputs to control input terminals of the coherent detectors $52_1$ and $52_2$, respectively.

In the branch selector 81, the outputs of the orthogonal detectors $51_1$ and $51_2$ are supplied to envelope calculators $55_1$ and $55_2$, respectively. The outputs of the envelope calculators are supplied to a comparator 58. The output of the comparator 58 is supplied to the control input terminal of the switch 82 and the input terminal of the loop band setter 83.

This embodiment is a selective diversity receiver having two branches and is based on the embodiment of FIG. 4. In FIG. 7, suffixes $_1$ and $_2$ indicate parts related to the two branches, respectively.

The orthogonal detectors $51_1$ and $51_2$ and coherent detectors $52_1$ and $52_2$ correspond to the signal processing units $31_1$ and $31_2$, filters $32_1$ and $32_2$, and detectors $33_1$ and $33_2$ of FIG. 3. The branch selector 81 corresponds to the diversity controller 34 and estimating unit 36 (41) of FIG. 3. The loop band setter 83 corresponds to the memory 35 and band controller 37 (42) of FIG. 3.

The operation of the coherent detection system of FIG. 7 will be explained with reference to FIG. 8.

The orthogonal detectors $51_1$ and $51_2$ orthogonally demodulate intermediate frequency signals converted from a received wave and transferred through the respective branches and provide each orthogonal I- and Q-channel demodulated signals. According to the demodulated signals, carrier regenerators in the coherent detectors $52_1$ and $52_2$ generate each a carrier signal phase-synchronized with the received wave. The coherent detectors $52_1$ and $52_2$ calculate each product of the carrier signal and demodulated signals and simultaneously provide transmitted information.

A relationship between each loop band width BL and a control voltage applied to the carrier regenerators of the coherent detectors $52_1$ and $52_2$ is measured in advance, and a table of loop band widths and corresponding control voltages is prepared. The table is stored in a read-only memory (not shown) incorporated in the loop band setter 83. The read-only memory also stores the ratio R (FIG. 1) of each loop band width to a corresponding Doppler shift fD, to minimize a bit error rate in consideration of a symbol structure, radio transmission path, transmission method, and modulation/demodulation method.

In the branch selector 81, the envelope calculators $55_1$ and $55_2$ each receive the I- and Q-channel demodulated signals and calculate instantaneous values R1 and R2 that form envelopes ① and ② of FIG. 8 according to instantaneous values i1, q1, i2, and q2 of the demodulated signals as follows:

$$R_1 = \sqrt{i_1^2 + q_1^2}$$

$$R_2 = \sqrt{i_2^2 + q_2^2}$$

The comparator 58 compares the instantaneous values R1 and R2 with each other and provides a binary signal ③ of FIG. 8 to show which of them is the greater.

In response to the logic value of the binary signal, the switch 82 selects one of the transmitted information pieces provided by the coherent detectors $52_1$ and $52_2$ corresponding to a larger one of the instantaneous values R1 and R2, i.e., a stronger one of the received electric fields.

A cross counter 59 provides a pulse signal ④ of FIG. 8 indicating change points of the binary signal ③.

The frequency Fb of alternations of the switch 82 is usually proportional to a Doppler shift in the received wave and is estimated as follows:

$$Fb = 2.6 \, P \, fD \qquad (2)$$

where the P is the probability of an inversion in the sizes of the values R1 and R2 per unit time and is dependent on the characteristics of the branches. (Refer to page 2–402 of "Method of Estimating Moving Speed with Use of Reception Diversity" by Tetsuyoshi Takenaka in Spring Convention Report of Electronics Information Communication Association.)

The cross counter 59 counts pulses of the pulse signal ④ and finds Fb×1/P of the expression (2), which is 2 if the branches have identical characteristics.

The loop band setter 83 substitutes the number Fb provided by the counter 59 for the left side of the expression (2) and estimates a momentarily changing Doppler shift fD as follows:

$$f_D = \frac{F_b}{2.6P}$$

The loop band setter 83 finds an optimum loop band width BL for the Doppler shift as follows:

BL=R0×fD

The loop band setter 83 looks up the table stored in the read-only memory thereof to find a control voltage corresponding to the loop band width BL. The control voltage is converted into an analog value, which is applied to the coherent detectors $52_1$ and $52_2$.

In this way, this embodiment variably sets a proper loop band width BL according to a Doppler shift involved in a received wave and stably regenerates a carrier signal. Accordingly, this embodiment greatly improves a demodulation performance compared with the prior art. Even if a large fading occurs in a radio transmission path of a ground mobile communication system, this embodiment is capable of reducing disturbances caused by phase noise due to the fading and stably regenerating a carrier signal phase-synchronized with a received wave.

As mentioned above, the coherent detection system according to this embodiment provides a stable demodulation performance even if there are large Doppler shifts.

FIG. 9 shows a coherent detection system according to a second embodiment of the third and fourth aspects of the present invention.

The same parts as those of FIGS. 6 and 7 are represented with like reference marks and are not explained again.

The embodiment of FIG. 9 differs from the embodiment of FIG. 7 in that it employs a branch selector 91 instead of the branch selector 81, and front end units $72_1$ and $72_2$ in front of orthogonal detectors $51_1$ and $51_2$. The front end units $72_1$ and $72_2$ provide the branch selector 91 with the levels of received electric fields.

The branch selector 91 differs from the branch selector 81 in that it has A-D converters $73_1$ and $73_2$ instead of the envelope calculators $55_1$ and $55_2$.

The front end units $72_1$ and $72_2$, orthogonal detectors $51_1$ and $51_2$, and coherent detectors $52_1$ and $52_2$ correspond to the signal processing units $31_1$ and $31_2$, filters $32_1$ and $32_2$, and detectors $33_1$ and $33_2$ of FIG. 3. The branch selector 91 corresponds to the diversity controller 34 and estimate unit 36 (41) of FIG. 3. A loop band setter 83 corresponds to the memory 35 and band controller 37 (42) of FIG. 3.

The operation of the coherent detection system of FIG. 9 will be explained.

The front end units $72_1$ and $72_2$ successively detect the electric field levels of a wave received through respective branches and provide signals RSSI1 and RSSI2 that indicate the levels as analog voltages. Generally, an instantaneous value of each of these signals is nearly proportional to an instantaneous value of an envelope of the received wave of each branch. Accordingly, the A-D converters $73_1$ and $73_2$ provide instantaneous values R1 and R2 of envelopes, similar to the envelope calculators $55_1$ and $55_2$ of FIG. 7.

In this way, the front end units $72_1$ and $72_2$ provide analog signals RSSI1 and RSSI2 that represent instantaneous values of envelopes involved in a received wave. Arrangements from an output terminal of each of the A-D converters $73_1$ and $73_2$ to a control input terminal of each of the coherent detectors $52_1$ and $52_2$ are the same as those of FIG. 7, so that this embodiment also stably regenerates a carrier signal from a received wave even if it involves a wide range of Doppler shifts. This embodiment greatly improves a demodulation performance compared with the prior art. Even if a large fading occurs in a radio transmission path, this embodiment absorbs a fluctuation in the transmission characteristics of the path according to a selective diversity method, to thereby provide a stable demodulation performance comparative to that of the delay detector.

Each of the above embodiments generates a reference carrier signal, which is used for coherent detection, according to a Costas method that processes signals in a base band. The present invention is not limited to the Costas method. The present invention may employ a multiplication method or an inverse modulation method.

A loop filter (not shown) incorporated in the coherent detector 52 of any one of the embodiments may be realized by any circuit having a function of presetting a loop band in response to a control voltage provided by the loop band setter 54 (83). For example, the loop filter may be made of active elements such as variable capacitance diodes, varactor diodes, transistors, and FETs. The loop filter must employ a circuit configuration proper for the active elements, to surely provide a required filter characteristic for a loop band.

The embodiments of FIGS. 7 and 9 set the probability P to 0.5 on an assumption that the two branches have identical characteristics. This does not limit the present invention. The two branches may have different characteristics, if the probability P is obtained, to a required certainty, in advance.

As explained above, the coherent detection system according to the first and second aspects of the present invention stores in advance Doppler shifts to be related to an input signal and corresponding pass bands of a filter in a memory, to minimize the bit error rate of a detector output. Then, the system finds the number of points where levels of the input signal or components of the input signal that form an envelope cross a threshold, estimates a Doppler shift according to the number and an expression that logically expresses a relationship between the number and the Doppler shift, looks up the memory according to the estimated Doppler shift, to find an optimum pass band, and sets the pass band to the filter.

This system always optimizes the pass band of the filter according to a Doppler shift, to surely regenerate a reference carrier signal through the filter and stabilize a demodulation performance.

The coherent detection system according to the third and fourth aspects of the present invention stores in advance Doppler shifts to be related to input signals separately provided through two branches and corresponding pass bands of filters in a memory, to minimize the bit error rate of detector outputs. Then, the system finds the number of points where levels of the input signals or components that form envelopes cross each other, estimates a Doppler shift according to the number and an expression that logically expresses a relationship between the number and the Doppler shift, looks up the memory according to the estimated Doppler shift, to find an optimum pass band, and sets the pass band to the filters.

This system always optimizes the pass bands of the filters according to a Doppler shift, to surely regenerate a reference carrier signal through the filters and to stabilize a demodulation performance.

A mobile communication system employing the coherent detection system of the present invention, therefore, is capable of securing a high transmission quality even if a received wave involves a widely fluctuating Doppler shift, and preventing resources from being repeatedly used at a reception end for channel setting and error correcting operations. The system thereby reduces operation costs and improves operation efficiency.

We claim:

1. A coherent detection system having:

signal processing means for processing an input signal, which has been modulated by information according to a modulation method, in a radio frequency band or base band in proper consideration of the modulation method and generating a modulation-component-suppressed control signal;

filter means for limiting the band of the control signal, to suppress noise components thereof; and detector means for adjusting an oscillation frequency according to the noise-suppressed control signal, regenerating a carrier signal phase-synchronized with the input signal, and carrying out a coherent detection process according to the carrier signal, to restore the transmitted information, the system comprising:

memory means for storing in advance Doppler shifts to be related to the input signal and corresponding pass bands to reduce the bit error rate of the restored information to below an allowable maximum when the corresponding Doppler shifts are present;

estimating means for finding levels of the input signal or instantaneous values R of the input signal that form an envelope, counting the number N per unit time of points where the envelope crosses a threshold, and estimating a Doppler shift fD according to an expression that indicates the ratio of the number N to the Doppler shift fD and involves the in-phase and orthogonal components of the input signal, the expression being provided by a distribution of the temporal differentiation of these components, a distribution of power spectra, and the instantaneous values normalized by the threshold; and band control means for retrieving a pass band corresponding to the estimated Doppler shift fD from the memory means and setting the pass band to the filter means.

2. A coherent detection system having:

signal processing means for processing an input signal, which has been modulated by information according to a modulation method, in a radio frequency band or base band in proper consideration of the modulation method and generating a modulation-component-suppressed control signal;

filter means for limiting the band of the control signal, to suppress noise components thereof; and detector means for adjusting an oscillation frequency according to the noise-suppressed control signal, regenerating a carrier signal phase-synchronized with the input signal, and carrying out a coherent detection process according to the carrier signal, to restore the transmitted information, the system comprising:

memory means for storing in advance Doppler shifts to be related to the input signal and corresponding pass bands to reduce the bit error rate of the restored information to below an allowable maximum when the corresponding Doppler shifts are present;

estimating means for finding levels of the input signal or values R of the input signal that form an envelope as well as an average Vav of the values R, counting the number N per unit time of points where the envelope crosses the average Vav, and estimating a Doppler shift fD according to an expression of $fD=\pi^{-1/2}e^{1/2}N$; and band control means for retrieving a pass band corresponding to the estimated Doppler shift fD from the memory means and setting the pass band to the filter means.

3. A coherent detection system having:

signal processing means for separately processing two input signals, which have been modulated by common information according to a modulation method and received through respective branches, in a radio frequency band or base band in proper consideration of the modulation method and generating respective modulation-component-suppressed control signals;

filter means for limiting the bands of the control signals, respectively, to suppress noise components thereof;

detector means for adjusting oscillation frequencies according to the respective noise-suppressed control signals, regenerating carrier signals phase-synchronized with the input signals, respectively, and simultaneously carrying out coherent detection processes according to the carrier signals, to separately provide the transmitted information; and diversity control means for finding levels of the input signals or components of the input signals that form envelopes and selecting one of the information pieces provided by the detector means according to the levels of the input signals, the system comprising:

memory means for storing in advance Doppler shifts to be related to the input signals and corresponding pass bands to reduce the bit error rate of the restored information to below an allowable maximum when the corresponding Doppler shifts are present;

estimating means for counting the number Fb of changes in the selection of the diversity control means per unit time and estimating a Doppler shift fD according to an expression of fD=Fb/1.3; and band control means for retrieving a pass band corresponding to the estimated Doppler shift fD from the memory means and setting the pass band to the filter means.

4. A coherent detection system having:

signal processing means for separately processing two input signals, which have been modulated by common information according to a modulation method and received through respective branches, in a radio frequency band or base band in proper consideration of the modulation method and generating respective modulation-component-suppressed control signals;

filter means for limiting the bands of the control signals, respectively, to suppress noise components thereof;

detector means for adjusting oscillation frequencies according to the respective noise-suppressed control signals, regenerating carrier signals phase-synchronized with the input signals, respectively, and simultaneously carrying out coherent detection processes according to the carrier signals, to separately provide the transmitted information; and diversity control means for finding levels of the input signals or components of the input signals that form envelopes and selecting one of the information pieces provided by the detector means according to the levels of the input signals, the system comprising:

memory means for storing in advance Doppler shifts to be related to the input signals and corresponding pass bands to reduce the bit error rate of the restored information to below an allowable maximum when the corresponding Doppler shifts are present;

estimating means for counting the number Fb of changes in the selection of the diversity control means per unit time and estimating a Doppler shift fD according to an expression of fD=Fb/2.6 P with the P being the probability of a change to occur in the selection of the diversity control means per unit time; and band control means for retrieving a pass band corresponding to the estimated Doppler shift fD from the memory means and setting the pass band to the filter means.

* * * * *